(12) United States Patent
Depenheuer

(10) Patent No.: US 10,921,188 B2
(45) Date of Patent: Feb. 16, 2021

(54) METHOD FOR CORRECTING A WAVELENGTH AND TUNING RANGE OF A LASER SPECTROMETER

(71) Applicant: Siemens Aktiengesellschaft, Munich (DE)

(72) Inventor: Daniel Depenheuer, Schwegenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/471,770

(22) PCT Filed: Dec. 22, 2017

(86) PCT No.: PCT/EP2017/084448
§ 371 (c)(1),
(2) Date: Jun. 20, 2019

(87) PCT Pub. No.: WO2018/115472
PCT Pub. Date: Jun. 28, 2018

(65) Prior Publication Data
US 2020/0088576 A1    Mar. 19, 2020

(30) Foreign Application Priority Data

Dec. 23, 2016 (DE) ...................... 10 2016 226 215.7
Jan. 9, 2017 (EP) ....................... 17150724

(51) Int. Cl.
*G01J 3/02* (2006.01)
*G01J 3/10* (2006.01)
(Continued)

(52) U.S. Cl.
CPC ............... *G01J 3/0297* (2013.01); *G01J 3/10* (2013.01); *G01J 3/433* (2013.01); *G01N 21/274* (2013.01);
(Continued)

(58) Field of Classification Search
CPC .. G01J 3/0297; G01J 3/10; G01J 3/433; G01J 2003/2866; G01N 21/274; G01N 21/39; G01N 2021/399
See application file for complete search history.

(56) References Cited

U.S. PATENT DOCUMENTS 5,459,574 A    10/1995    Lee et al.
5,930,000 A *    7/1999    Brand .................... G01N 21/39
                                                                      250/343
(Continued)

FOREIGN PATENT DOCUMENTS

CN      105021569      11/2015
DE      102011077634      12/2012
(Continued)

OTHER PUBLICATIONS

Lin Xin et al: "Measurements of CO concentration distribution for Mars atmospheric entry by combining OES and TDLAS"; Optomechatronic Micro/Nano Devices and Components III : Lausanne, Switzerland; [Proceedings of SPIE, ISSN 0277-786X, SPIE, Bellingham, Wash, Bd. 9543, May 4, 2015 (May 4, 2015), pp. 954314-954314, XP060053609, DOI: 10.1117/12.2180592; ISBN: 978-1-62841-730-2; 2007.
(Continued)

*Primary Examiner* — Dominic J Bologna
(74) *Attorney, Agent, or Firm* — Cozen O'Connor

(57) ABSTRACT

A method for correcting a wavelength and a tuning range of a laser spectrometer in which the light from a wavelength-tunable laser diode, after being radiating through a gas, is detected and evaluated, wherein the laser diode is periodically driven with a current ramp, such that a time-resolved absorption spectrum of the gas is obtained upon the detection of the light, where in order to correct the wavelength and the tuning range of the laser spectrometer, a first step involves readjusting the central wavelength of the laser
(Continued)

diode via the temperature thereof and based on the position of one of two different selected absorption lines in the detected absorption spectrum, and a second step involves correcting the tuning range of the laser diode via the gradient of the current ramp such that the spacing of the two absorption lines in the detected absorption spectrum remains constant.

13 Claims, 3 Drawing Sheets

(51) Int. Cl.
*G01J 3/433* (2006.01)
*G01N 21/27* (2006.01)
*G01N 21/39* (2006.01)
*G01J 3/28* (2006.01)

(52) U.S. Cl.
CPC ...... *G01N 21/39* (2013.01); *G01J 2003/2866* (2013.01); *G01N 2021/399* (2013.01); *G01N 2201/0231* (2013.01)

(56) References Cited

U.S. PATENT DOCUMENTS

| | | | |
|---|---|---|---|
| 6,522,402 B1* | 2/2003 | Wang | G01J 3/42 356/326 |
| 7,586,613 B2 | 9/2009 | Wilkins et al. | |
| 2007/0246653 A1* | 10/2007 | Zhou | G01N 21/39 250/339.1 |
| 2015/0276587 A1* | 10/2015 | Cowie | G01N 21/274 356/437 |
| 2017/0059474 A1* | 3/2017 | Cohen | H01S 3/0071 |

FOREIGN PATENT DOCUMENTS

| | | |
|---|---|---|
| DE | 102011080086 | 1/2013 |
| DE | 102011083750 | 4/2013 |
| DE | 102013201459 | 7/2014 |
| WO | WO2009/128138 | 8/2011 |
| WO | WO2013/191728 | 12/2013 |

OTHER PUBLICATIONS

Zhang Keke et al: "Gas temperature measurement using first harmonic based on tunable diode laser absorption spectroscopy", Proceeding of the 11th World Congress on Intelligent Control and Automation, IEEE, pp. 2929-2933, XP032742785; DOI: 10.1109/WCICA.2014.7053194; 2014.

* cited by examiner

METHOD FOR CORRECTING A WAVELENGTH AND TUNING RANGE OF A LASER SPECTROMETER

CROSS-REFERENCE TO RELATED APPLICATIONS

This is a U.S. national stage of application No. PCT/EP2017/084448 filed Dec. 22, 2017. Priority is claimed on German Application No. 102016226215.7 filed Dec. 23, 2016 and EP Application No. 17150724 filed Jan. 9, 2017, the contents of which are incorporated herein by reference in their entirety.

BACKGROUND OF THE INVENTION

1. Field of the Invention

The invention relates to a method for correcting the wavelength and the tuning range of a laser spectrometer, in which the light of a wavelength-tunable laser diode after radiating through a gas is detected and evaluated, wherein the laser diode is periodically driven with a current ramp, such that a time-resolved absorption spectrum of the gas is obtained upon the detection of the light, wherein in the absorption spectrum currently obtained, the actual position of an absorption line of the gas is compared with a target position of the same absorption line detected and stored in a preceding one-off adjustment of the laser spectrometer and in a correction step, with a deviation of the actual position of the absorption line from the target position, the temperature of the laser diode is changed until the actual position corresponds to the target position.

2. Description of the Related Art

DE 10 2011 080 086 A1 or DE 10 2013 201 459 A1 each disclose a method for correcting the wavelength and tuning range of a laser spectrometer.

In laser absorption spectroscopy a measurement gas mixture is radiated through with the light of a wavelength-tunable laser diode and the concentration of a gas component of interest of the measurement gas mixture is determined based on the reduction of the light intensity caused by the absorption of the light at the point of a selected absorption line of the gas component. Here, the laser diode is driven periodically with a triangular or sawtooth-shaped current-time function (current ramp), in order to sample the absorption line of the gas component wavelength-dependently. To enhance the measurement accuracy, the current-time function can be modulated with a sinusoidal signal of predetermined frequency f and amplitude, and the light can be detected and evaluated phase-sensitively at a higher harmonic of the frequency, usually double the frequency 2f (known as wavelength modulation spectroscopy or WMS). The 2f signal component in the detected light or from the detection signal obtained is dependent on the modulation ratio, i.e., on the ratio of the modulation amplitude to the width of the sampled absorption line, and is at its maximum at a modulation ratio of 2.2, as disclosed in DE 10 2011 083 750 A1.

Along with the injection current, the temperature of the laser diode also determines to a large degree the intensity and wavelength of the light created, which is why the laser diode is mounted on a heat sink, of which the temperature is regulated. Because of the ageing the optical performance of the laser diode reduces and the wavelength of the light created changes, so that measures for wavelength stabilization are required. To this end, as is known from the aforementioned DE 10 2011 080 086 A1 or DE 10 2013 201 459 A1, as well as the absorption line of the gas component to be measured, an absorption line of a reference gas or gas mixture is also sampled, which lies in the same light path together with the measurement gas and is thus radiated through at the same time as the gas. The temperature of the laser diode or the heat sink is then regulated via the position of the absorption line of the reference gas in the detected absorption spectrum such that this reference absorption line is always located at the same point. Thus, the absorption line of the gas component of interest also always lies approximately at the same point of the current-time function sampling it.

U.S. Pat. No. 5,459,574 A discloses that a part of the light coming from the laser diode can be coupled out from the light path to the measurement gas mixture via a beam splitter and can be detected separately after radiating through the reference gas.

DE 10 2011 080 086 A1 or DE 10 2013 201 459 A1 further disclose that the laser diode can be driven at the start and at the end of the current ramp with different current bursts and, based on the different current strengths of the current bursts and the light intensities detected at the positions of the current bursts, a light intensity value for the current ramp at the position of the absorption line of interest can be computed by interpolation with which the light intensity detected there will be normalized. The accuracy of the interpolation, which is a simple linear process with different current bursts, can be enhanced by the laser diode being driven at regular intervals with an additional current burst, of which the current strength is different from that of the other current bursts, and that the light intensity value for the current ramp at the position of the absorption line of interest can be computed by polynomial interpolation on the basis of the current strengths of all current bursts and the light intensities detected at the positions of the current bursts.

As explained in DE 10 2011 083 750 A1, laser spectrometers must be set or adjusted for the first time during their manufacture in relation to the wavelength and the tuning range. The fine adjustment of the wavelength can be performed, as already explained above, with the aid of a reference absorption line, because its wavelength position is determined with a greater accuracy than the accuracy of a wave meter, for example. For this purpose, a cuvette (gas cell) filled with a reference gas is brought into the light path of the laser spectrometer. The tuning range, i.e., the wavelength change for a predetermined current-time function (current ramp), can be determined with the aid of an etalon, which is likewise brought into the light path of the laser spectrometer.

While the cuvette filled with the reference gas or reference gas mixture can remain in the laser spectrometer, in order, as explained above, to adjust the position of the reference absorption line in the detected absorption spectrum by way of the temperature of the laser diode during ongoing measurement operation, a readjustment of the tuning range in ongoing measurement operation using an etalon is not possible. The assumption already mentioned that, when the position of the reference absorption line in the detected absorption spectrum is kept constant, the position of the absorption line of the gas component to be measured also remains constant, only approximately holds true, because with ageing of the laser diode not only its central wavelength but also its tuning behavior varies over the current. Thus, for example, when the laser diode is driven with a current ramp of 30 mA (peak-to-peak) the change in wavelength achieved is shifted, depending on ageing, from its original 40 GHz to 42 GHz. On evaluation of the absorption line of interest of the gas component to be measured, based on its surface, this would lead to a change in the measurement result of around 5%. It is also possible, as a result of the changed width of the absorption line, that the evaluation algorithm no longer functions reliably, if the evaluation is based, for example, on a multi-variant analysis, in which the measured absorption spectrum is compared with previously recorded or computed spectra. The problem is exacerbated when the laser diode is tuned over a very large range, so that the change in the injection current and that of the wavelength are no longer proportional to one another. In practice, large tuning ranges of this type with an appreciable non-linear component in the tuning rate regularly occur. Such non-linearities can also be dependent on examplars, because each individual laser diode behaves differently.

Therefore a regular verification of the measurements of the laser spectrometer is usually performed. If the measurement results during the verification no longer correspond to expectations, then the device is newly calibrated or re-calibrated. Depending on the device, this can be done by the customer, by a service engineer or only at the factory.

WO 2013/191728 A1 discloses a computational compensation for the influence of the laser ageing on the measurement result referred to as two-point calibration based on the current values measured at the actual positions of two known absorption lines of a known gas component with known concentration, of the distance between two actual positions and the absorptions measured at the actual positions. Such a two-point calibration, also known from U.S. Pat. No. 7,586,613 B2, is only able to be applied in the case of direct absorption spectroscopy.

SUMMARY OF THE INVENTION

In view of the foregoing, it is therefore an object of the invention to make possible a correction of the wavelength and of the tuning range of a laser spectrometer applicable both in the case of direct absorption spectroscopy and also in the case of wavelength modulation spectroscopy, without having to take this out of the ongoing measurement operation or the measurement arrangement. This applies in particular to in-situ measurements, if the laser diode and the detector are accommodated, for example, in measurement heads installed at opposite points of a process gas line, or an exhaust gas duct.

This and other objects and advantages are achieved in accordance with the invention by a method, where
  in the absorption spectrum currently obtained, by comparing the current position of a further absorption line with a target position of the same absorption line detected and stored in a preceding one-off adjustment of the laser spectrometer and
  in a further correction step, with a deviation of the actual position of the further absorption line from its target position, by changing the gradient of the current ramp until the actual position corresponds to the target position.

The one-off adjustment of the laser spectrometer is also to be understood, as well as the initial ex-works setting of its wavelength and its tuning range, as any new calibration or re-calibration that is performed by the customer, by a service engineer or in the factory.

The inventive method thus makes provision, in a first step, for the central wavelength of the laser diode to be adjusted via its temperature and based on the position of one of two differently selected, i.e., uniquely detectable, absorption lines in the detected absorption spectrum and, in a second step, for the tuning range of the laser diode to be corrected by way of the gradient of the current ramp such that the distance between the two absorption lines in the detected absorption spectrum remains the same. The absolute wavelengths of the two absorption lines are known. As a result, the tuning range of the laser diode, i.e., the wavelength change with a linear current-time function (current ramp), can be computed directly. The correction of the wavelength and the tuning range is all the more accurate and reliable, the greater is the distance between the two absorption lines. Therefore, the two absorption lines are preferably selected so that one of them lies as close as possible to the start of the tuning range and the other lies as close as possible to its end while, for example, the absorption line of the gas components to be measured preferably lies in the middle of the tuning range.

The correction of the tuning range of the laser diode via the gradient of the current ramp enables the central wavelength previously corrected via the temperature of the laser diode to be changed again, so that both correction steps are preferably performed repeatedly one after another. The recursion can be started and can be performed for the time during which and the way in which the deviations between the target and actual positions exceed predetermined threshold values.

Basically, instead of being corrected via its temperature, the central wavelength of the laser diode could be corrected by adding a current offset to the current ramp. However, the tuning characteristics of laser diodes typically change very much more strongly with changes of the absolute level of the current than they do with a change in the laser temperature. Furthermore, with many laser diodes, a relatively large change in the current level would have to be used, while a comparatively small temperature change is sufficient. Therefore, for the correction of the central wavelength, in almost all cases a change in the laser temperature is preferable to a change in the laser current.

In the event of the laser diode having a non-linear tuning behavior, in accordance with an advantageous embodiment of the inventive method, the current ramp is formed from a current-time function with one linear term and at least one non-linear term. The linear function term corresponds in this case to the gradient of the current ramp, while the at least one non-linear term refers to a non-linear course of the gradient. During tuning of the laser diode, the position of at least one additional absorption line lying between the two absorption lines is then detected. With a deviation between the correctly detected actual position of this additional absorption line and the target position of the same absorption line detected and stored in the preceding one-off adjustment of the laser spectrometer, in an additional correction step, the at least one non-linear term is changed until the actual position corresponds to the target position. In the simplest case, the at least one non-linear function term can involve a quadratic or cubic term, wherein in particular with very large tuning ranges, more complex terms can also be required, which more adequately describe the tuning behavior of the laser diode.

Here too it can be necessary, after each change in the non-linear term/terms, to re-correct the corrected positions of the other reference absorption lines by adaptation of the laser temperature and of the tuning range of the current.

The correction steps are performed automatically by the laser spectrometer. Thereafter, the laser diode again tunes exactly the same wavelength range as it did during the calibration. Changes in the tuning behavior through laser ageing have thus been compensated for.

Because laser ageing is a very slow process and has external interference influences and noise overlaid on it, the correction steps are in practice only performed rarely and only when a change in position of the observed absorption lines compared to the calibration is established, or only very long averaged spectra are used for the correction. As already mentioned, the correction of the wavelength and the tuning range can be achieved in ongoing measurement operation of the laser spectrometer, which does not necessarily mean however that the gas component of interest is measured during the correction. The decisive factor in the inventive method is that the correction is done automatically and the laser spectrometer does not have to be taken out of measurement operation or out of the measurement arrangement to do so.

If the ambient conditions (pressure, temperature) are the same during the one-off adjustment, e.g., calibration, of the laser spectrometer and at the time of correction of its wavelength and of its tuning range, then in an advantageous way selected absorption lines of the measurement gas mixture, if necessary also the absorption line of the gas component to be measured, can be used for the correction. Therefore, as soon as two or more absorption lines can be safely measured in the absorption spectrum of the measurement gas mixture the inventive method can be applied. To do this, only a functional enhancement in the software is essentially necessary for an existing laser spectrometer.

In order to be independent of the ambient conditions, as an alternative, if necessary in addition, absorption lines of a reference gas or gas mixture can be used, where the reference gas contained in a cuvette and measurement gas mixture lying in the same light path are radiated through after one another. Here, the absorption lines of the reference gas can be detected with the same detector with which the absorption line of the gas component to be measured in the measurement gas mixture is detected. As an alternative, if the cuvette with the reference gas is arranged before the measurement gas mixture, then a part of the light emerging from the reference gas can be coupled out via a beam splitter from the light path to the measurement gas mixture and can be detected separately with a further detector. In this case, the separately detected absorption spectrum of the reference gas is not overlaid by the measurement gas mixture. Although the detected absorption spectrum of the measurement gas mixture is overlaid by that of the reference gas, the separately detected absorption spectrum of the reference gas can be subtracted from it, however, so that the absorption spectrum of the measurement gas mixture is also obtained without overlays. As an alternative, the cuvette with the reference gas can be arranged between the beam splitter and the further detector, so that the detected absorption spectrum of the measurement gas mixture is not overlaid by that of the reference gas.

The inventive correction method can be applied both in the case of direct absorption spectroscopy and also in the case of wavelength modulation spectroscopy. While in direct absorption spectroscopy the concentration of the gas component of interest is determined directly from the reduction of the light intensity (absorption) detected at the point of the absorption line, in wavelength modulation spectroscopy during the comparatively slow wavelength-dependent sampling of the absorption line the wavelength of the created light is additionally modulated with high frequency and small amplitude sinusoidally. The light is then detected phase-sensitively at a higher harmonic of the frequency. In accordance with an advantageous embodiment of the inventive method, in the case of wavelength modulation spectroscopy the amplitude of the wavelength modulation is also changed proportionally with the change in the gradient or the non-linear term of the current ramp. As an alternative, after changing the gradient or the non-linear term of the current ramp, a change in the modulation ratio can be established based on one of the phase-sensitively detected absorption lines and the modulation can be corrected as a function thereof.

It is also an object of the invention to provide a laser spectrometer for implementing the method in accordance with the disclosed embodiments of the invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For further explanation of the invention the reader is referred below to the figures of the drawing, in which.

DETAILED DESCRIPTION OF THE EXEMPLARY EMBODIMENTS

Figure 1:
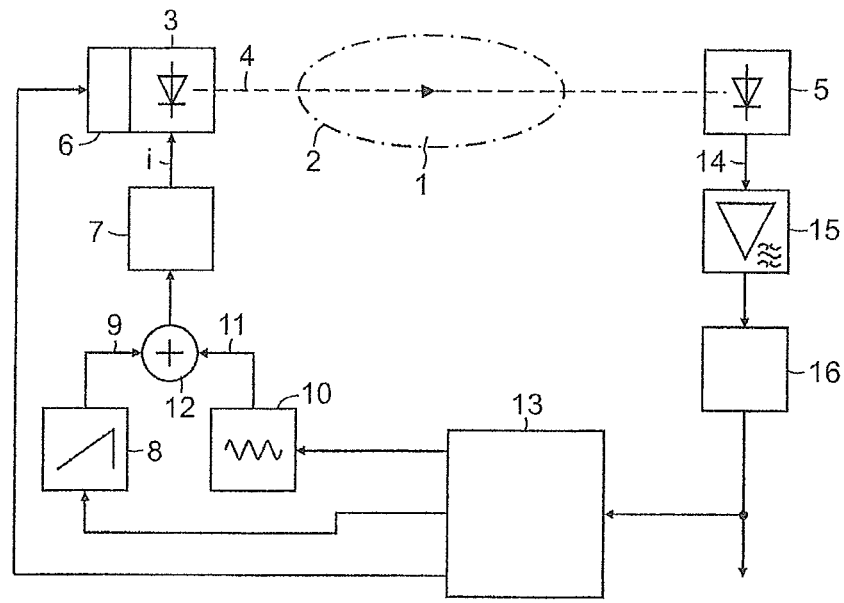
FIG. 1 shows a schematic diagram of a laser spectrometer for performing the inventive method.

FIG. 1 shows an example of a laser spectrometer for measuring the concentration of at least one gas component of interest of a measurement gas mixture 1, which is contained in a measurement volume 2, for example, of a measurement cuvette or a process gas line. The spectrometer contains a laser diode 3, of which the light 4 falls through the measurement gas 1 onto a detector 5. The laser diode 3 is mounted on a temperature-regulated heat sink 6 and is driven by a controllable current source 7 with an injection current i. The intensity and wavelength of the created light 4 are dependent on the injection current i and the operating temperature of the laser diode 3. The current source 6 is driven periodically by a first signal generator 7 with a ramp-shaped current-time function (current ramp) 9, in order to sample a selected absorption line of a gas component of interest of the measurement gas mixture 1 with the correspondingly modulated light 4. The current-time function 9, as well as having a linear function term (parameter) specifying the gradient of the current ramp, can have one or more function terms, which bring about a non-linear deformation of the current ramp. A second signal generator 10 creates a sinusoidal signal (modulation signal) 11 of frequency f, with which the current ramp 9 is modulated in a summation element 12.

The operating temperature of the laser diode 3, the function terms of the current ramp 9 and the amplitude of the modulation signal 2 can be set via a control device 13.

The detector 5 creates a detector signal 14 as a function of the detected light intensity, which contains as information a time-resolved absorption spectrum of the measurement gas mixture 1. The detector signal 14 is amplified in a frequency-selective amplifier 15 at the nth, preferably second, harmonic of the modulation frequency f and in a downstream evaluation device 16 is further processed phase-sensitively (lock-in) and evaluated to a measured value for the concentration of the gas component of interest of the measurement gas mixture.

Figure 2:
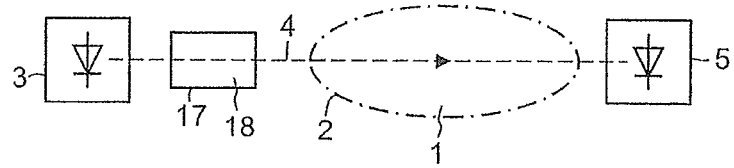
FIGS. 2 to 4 show further exemplary embodiments for the laser spectrometer.
Figure 3:
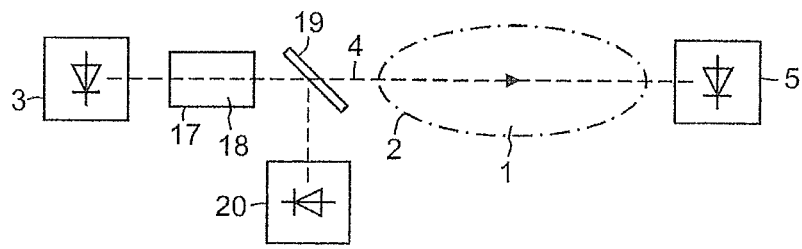
Figure 4:
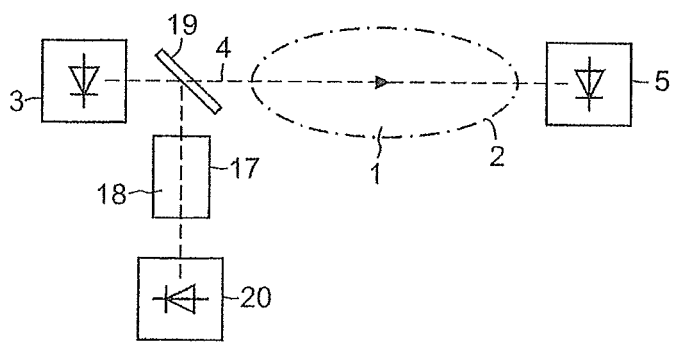

Based on a section from FIG. 1, FIGS. 2, 3 and 4 show different embodiments of the laser spectrometer, in which a reference gas or reference gas mixture 18 contained in a cuvette 17 is radiated through with the light 4 of the laser diode 3 at the same time as the measurement gas mixture 1. In the examples of FIGS. 2 and 3, the cuvette 17 and the measurement volume 2 lie behind one another in the same light path, so that the detector 5 detects over the tuning range of the laser diode 3 both the absorption spectrum of the measurement gas mixture 1 and also that of the reference gas or reference gas mixture 18. In the example depicted in FIG. 3, a part of the light 4 emerging from the cuvette 17 is coupled out via a beam splitter 19 from the light path to the measurement volume 2 and conveyed to a further detector 20, which in this way separately detects the absorption spectrum of the reference gas or reference gas mixture 18. For establishing the concentration of the gas component of interest of the measurement gas mixture 1 by the evaluation device 16, the separately detected absorption spectrum of the reference gas or reference gas mixture 18 can be subtracted beforehand from the measurement gas mixture 1, e.g., directly after the detector 5. Finally, in the example depicted in FIG. 4, the cuvette 17 is arranged in the light path between the beam splitter 19 and the further detector 20, so that the absorption spectrum of the measurement gas mixture 1 detected by the detector 5 is not overlaid by that of the reference gas or reference gas mixture 18.

FIGS. 5 to 9 show exemplary graphical plots of the effect of the inventive correction of the wavelength and of the tuning range of the laser spectrometer on the detected absorption spectrum 21 over the wavelength tuning range of the laser diode 3, which is normalized here to a range of 0 to 1000. The absorption spectrum 21 can involve that of the measurement gas mixture 1 and/or that of the reference gas 18, where only the absorption lines 22, 23 and 24 considered in the inventive method are shown here.

Figure 5:
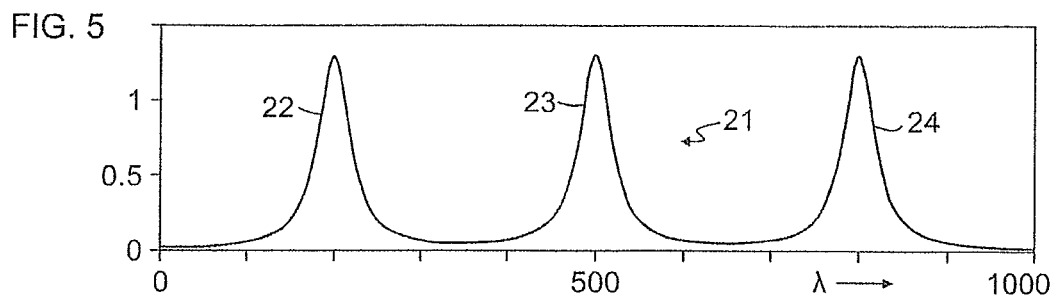
FIGS. 5 to 9 show exemplary graphical plots of the effect of the inventive correction of the wavelength and of the tuning range of the laser spectrometer on the detected absorption spectrum.

FIG. 5 shows the absorption spectrum obtained after a calibration of the laser spectrometer 21 with the target positions of the absorption lines 22, 23 and 24.

Figure 6:
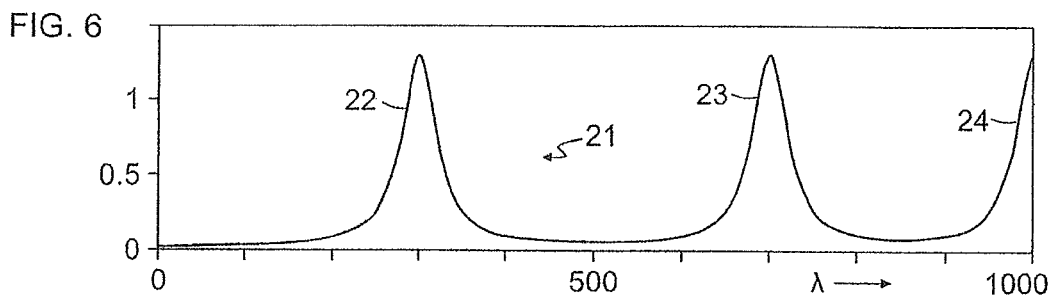

FIG. 6 shows the same absorption spectrum 21 after longer use of the laser spectrometer, where the positions of the absorption lines 22, 23 and 24 have shifted towards the current actual positions.

Figure 7:
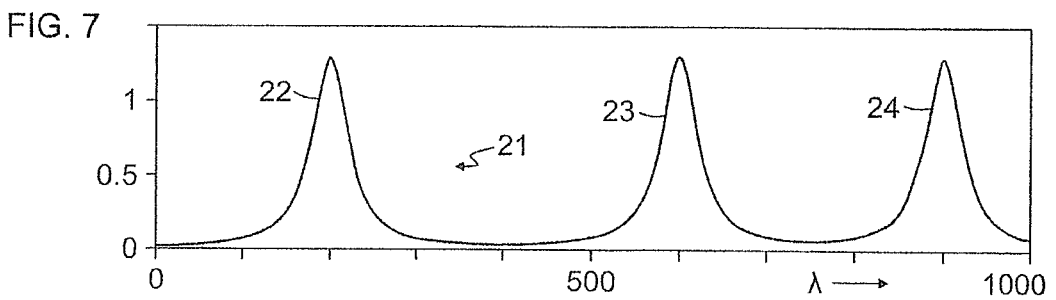

FIG. 7 shows how, based on the absorption line 22, by changing the temperature of the laser diode 3, the actual position of this absorption line 22 is shifted back to the target position. With the ageing of the laser diode 3 not only its central wavelength but also its tuning behavior has changed over the current. Consequently, the actual positions of the remaining absorption lines 23 and 24 continue to deviate from the target positions.

Figure 8:
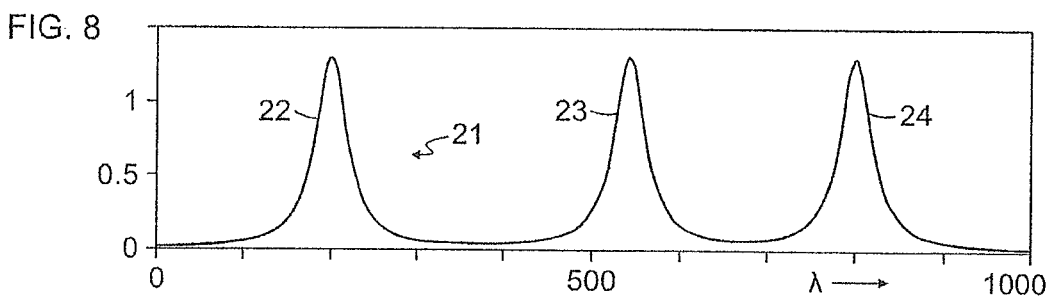

FIG. 8 shows how, based on the absorption line 24 by changing the gradient of the current ramp 9 (linear term of the current-time function), the actual position of this absorption line 24 is shifted back to its target position. The tuning behavior of the laser diode 3 is non-linear. As a result, the actual position of the middle absorption line 23 still deviates from its target position.

Figure 9:
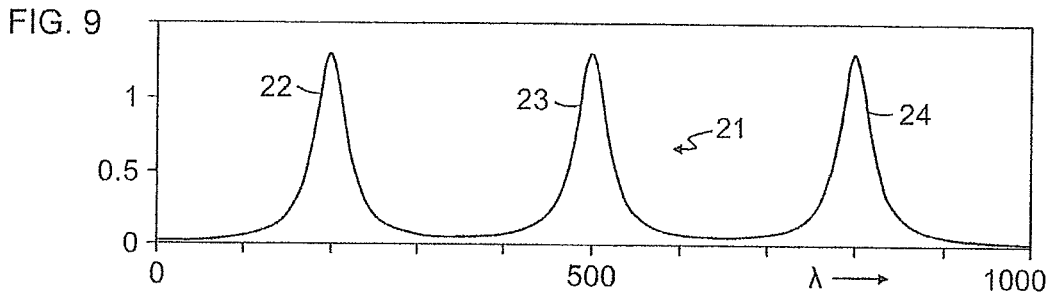

Finally, FIG. 9 shows how, based on the absorption line 23, by changing the non-linear term of the current ramp 9, the actual position of this absorption line 24 is also shifted back to its target position. As a result, the corrected absorption spectrum 21 shown in FIG. 5 corresponds to that depicted in FIG. 1.

The correction steps explained in conjunction with FIGS. 7 to 9 must if necessary be performed several times after one another.

Figure 10:
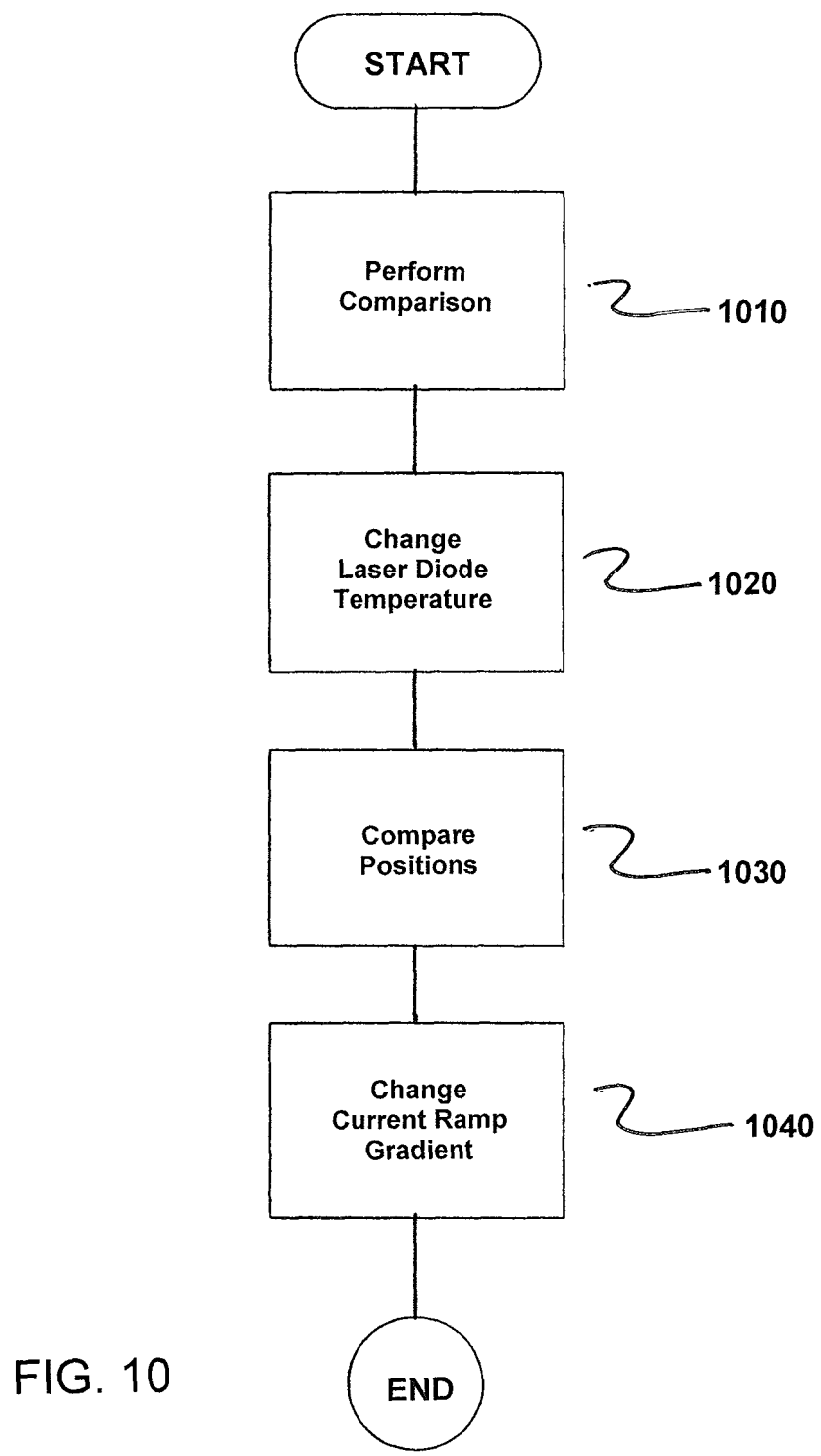
FIG. 10 is a flowchart of the method in accordance with the invention.

FIG. 10 is a flowchart of the method for correcting the wavelength and the tuning range of a laser spectrometer, in which light of a wavelength-tunable laser diode 3 is detected and evaluated after radiating through a gas 1, 18, where the laser diode 3 is periodically driven with a current ramp 9, such that a time-resolved absorption spectrum of the gas 1, 18 is obtained upon the detection of the light 4. The method comprises comparing, in a currently obtain absorption spectrum an actual position of an absorption line 22 of the gas 1, 18 with a target position of the same absorption line 22 detected and stored in a preceding one-off adjustment of the laser spectrometer, as indicated in step 1010.

Next, in a correction step, with a deviation of the actual position of the absorption line 22 from the target position, a temperature of the laser diode 3 is changed until an actual position corresponds to the target position, as indicated in step 1020.

Next, in the absorption spectrum currently obtained, the actual position of a further absorption line 24 is compared with the target position of the same absorption line 24 detected and stored in a preceding one-off adjustment of the laser spectrometer, as indicated in step 1030.

Next, in a further correction step, with a deviation of the actual position of the further absorption line 24 from a target position of the further absorption line 24, the gradient of the current ramp 9 is changed until the actual position corresponds to the target position, as indicated in step 1040.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for correcting a wavelength and a tuning range of a laser spectrometer, in which light of a wavelength-tunable laser diode is detected and evaluated after radiating through a gas, the laser diode being periodically driven with a current ramp, such that a time-resolved absorption spectrum of the gas is obtained upon the detection of the light, the method comprising:

comparing, in a currently obtained absorption spectrum, an actual position of an absorption line of the gas with a target position of the same absorption line detected and stored in a preceding one-off adjustment of the laser spectrometer;

changing, in a correction step, with a deviation of the actual position of the absorption line from the target position, a temperature of the laser diode until an actual position corresponds to the target position;

comparing, in the absorption spectrum currently obtained, the actual position of a further absorption line with the target position of the same absorption line detected and stored in a preceding one-off adjustment of the laser spectrometer; and changing, in a further correction step, with a deviation of the actual position of the further absorption line from a target position of the further absorption line, the gradient of the current ramp until the actual position corresponds to the target position.

2. The method as claimed in claim 1, wherein the correction step and the further correction step are performed repeatedly after one another.

3. The method as claimed in claim 1, wherein the correction step and the further correction step are performed as a function of a respective deviation between the target position and an actual position exceeding a predetermined threshold value.

4. The method as claimed in claim 1, wherein the current ramp is formed from a current-time function with one linear and at least one non-linear term;

wherein in the currently obtained absorption spectrum, the actual position of at least one additional absorption line lying between the absorption line and the further absorption line is compared with the target position of the same absorption line detected and stored in the preceding one-off adjustment of the laser spectrometer; and wherein in an additional correction step following the further correction step, with a deviation of the actual position of the at least one additional absorption line from a target position of the at least one additional absorption line, the at least one non-linear term is changed until the actual position corresponds to the target position.

5. The method as claimed in claim 1, wherein the at least one absorption line utilized for correction of the wavelength and the tuning range of the laser spectrometer involves a selected absorption line of a gas component of a measurement gas mixture, in which a concentration of the same or of another gas component of interest of the measurement gas mixture is determined by evaluating an absorption line of the gas component concerned.

6. The method as claimed in claim 1, wherein at least one of the absorption lines utilized for correction of the wavelength and the tuning range of the laser spectrometer involves a selected absorption line of a reference gas or reference gas mixture.

7. The method as claimed in claim 6, wherein radiation through the reference gas or reference gas mixture and through a measurement gas mixture occurs simultaneously.

8. The method as claimed in claim 7, wherein the reference gas or reference gas mixture and the measurement gas mixture lying in the same light path are radiated through after one another and a part of light emerging from the reference gas or reference gas mixture is coupled out via a beam splitter from the light path to the measurement gas mixture and detected separately.

9. The method as claimed in claim 8, wherein the separately detected spectrum of the reference gas or reference gas mixture is subtracted from the spectrum of the measurement gas mixture.

10. The method as claimed in claim 6, wherein a part of the light emanating from the laser diode is coupled out via a beam splitter from the light path to the measurement gas mixture and is detected separately after radiating through the reference gas or reference gas mixture.

11. The method as claimed in claim 1, wherein the current ramp is modulated with a sinusoidal signal of predetermined frequency and modulation amplitude and the light is detected phase-sensitively at a higher harmonic of the frequency; and wherein the modulation amplitude is also changed in proportion with a change in the gradient or in the non-linear term of the current ramp.

12. The method as claimed in claim 1, wherein the current ramp is modulated with a sinusoidal signal of predetermined frequency and modulation amplitude and the light is detected phase-sensitively at a higher harmonic of the frequency; and wherein after the gradient or the non-linear term of the current ramp is changed based on the phase-sensitively detected absorption lines, a change in the modulation ratio is established and the modulation amplitude is corrected as a function thereof.

13. A laser spectrometer comprising:

a wavelength-tunable laser diode via which light is directed through a gas;

a temperature-regulated heat sink, the wavelength-tunable laser diode being mounted on the temperature-regulated heat sink;

a controllable current source which periodically drives the wavelength-tunable laser diode with a current ramp;

a detector which receives the light after being transmitted through the gas and which generates a detector signal containing information on a time-resolved absorption spectrum of the gas;

an evaluation unit which processes and evaluates the detector signal to a measured value for a concentration of a gas component of interest of the gas; and a controller which sets or controls a temperature of the temperature-regulated heat sink and a gradient of the current ramp;

wherein the evaluation unit is configured to:

compare, in a currently obtained absorption spectrum, an actual position of an absorption line of the gas with a target position of the same absorption line detected and stored in a preceding one-off adjustment of the laser spectrometer;

compare, in the absorption spectrum currently obtained, the actual position of a further absorption line with the target position of the same absorption line detected and stored in a preceding one-off adjustment of the laser spectrometer; and wherein the controller is configured to:

change, in a correction step, with a deviation of the actual position of the absorption line from the target position, a temperature of the wavelength tunable laser diode until an actual position corresponds to the target position; and change, in a further correction step, with a deviation of the actual position of the further absorption line from a target position of the further absorption line, the gradient of the current ramp until the actual position corresponds to the target position.

* * * * *